(12) United States Patent
Huang

(10) Patent No.: US 8,094,219 B2
(45) Date of Patent: Jan. 10, 2012

(54) IMAGE-SENSING MODULE FOR DIGITAL OPTICAL DEVICE

(75) Inventor: Yao-Ching Huang, Taichung (TW)

(73) Assignee: Asia Optical Co., Inc., Tepz, Taichung (TW)

( * ) Notice: Subject to any disclaimer, the term of this patent is extended or adjusted under 35 U.S.C. 154(b) by 458 days.

(21) Appl. No.: 12/332,381

(22) Filed: Dec. 11, 2008

(65) Prior Publication Data

US 2009/0303360 A1 Dec. 10, 2009

(30) Foreign Application Priority Data

Jun. 5, 2008 (TW) ................................ 97120926 A

(51) Int. Cl.
*H04N 5/335* (2011.01)
(52) U.S. Cl. ...................................................... 348/294
(58) Field of Classification Search .................... 379/68, 379/69, 70, 74; 348/340, 294, 374; 455/575, 455/563; 165/80; 257/252, 276
See application file for complete search history.

(56) References Cited

U.S. PATENT DOCUMENTS

| 6,339,681 | B1* | 1/2002 | Takeshita | ........................ 396/79 |
| 6,751,098 | B2* | 6/2004 | Dailey et al. | .................. 361/704 |
| 7,159,947 | B1* | 1/2007 | Lee | ........................... 297/411.37 |
| 7,782,395 | B2* | 8/2010 | Lee et al. | ........................ 348/375 |
| 7,821,554 | B2* | 10/2010 | Ma et al. | ........................ 348/294 |

* cited by examiner

*Primary Examiner* — David Ometz
*Assistant Examiner* — Fayez Bhuiyan
(74) *Attorney, Agent, or Firm* — Thomas|Kayden

(57) ABSTRACT

An image-sensing module. A base includes a plurality of sidewalls and an accommodation hole encompassed by the sidewalls. A flexible printed circuit board includes an installation portion and a through hole formed on the installation portion. A heat-dissipation board is fixed to a bottom surface of the installation portion of the flexible printed circuit board and is aligned with the through hole. An image sensor is fixed to a top surface of the installation portion of the flexible printed circuit board and is aligned with the through hole. The heat-dissipation board, flexible printed circuit board, and image sensor are accommodated in the accommodation hole of the base.

6 Claims, 4 Drawing Sheets

IMAGE-SENSING MODULE FOR DIGITAL OPTICAL DEVICE

CROSS REFERENCE TO RELATED APPLICATIONS

This Application claims priority of Taiwan Patent Application No. 097120926, filed on Jun. 5, 2008, the entirety of which is incorporated by reference herein.

BACKGROUND OF THE INVENTION

1. Field of the Invention

The invention relates to an assembly for an optical device, and more particularly to an image-sensing module.

2. Description of the Related Art

Referring to FIG. 1, a conventional image-sensing module 10 disposed in an optical device (such as a digital camera) comprises a base 11, an image sensor 12, and a flexible printed circuit board (FPC) 13. The image-sensing module 10 can rapidly move on a plane perpendicular to an optical axis, performing anti-shake functions.

The image sensor 12 may be a charge coupled device (CCD) or a complementary metal-oxide semiconductor (CMOS).

The flexible printed circuit board 13 comprises a main portion 131, an installation portion 132, and a through hole 133. The installation portion 132 bends and extends from the main portion 131. The through hole 133 is formed on the installation portion 132.

When the image-sensing module 10 is assembled, the image sensor 12 is soldered to the flexible printed circuit board 13 using a low-temperature soldering technique and is aligned with the through hole 133. The image sensor 12 and flexible printed circuit board 13 are then assembled in the base 11. Glue or adhesive is filled between the image sensor 12 and the base 11, positioning the image sensor 12 in the base 11.

Nevertheless, the image-sensing module 10 has many drawbacks. Specifically, massive heat is generated during operation of the image sensor 12. As the image sensor 12 provides no heat-dissipation means, the image sensor 12 and flexible printed circuit board 13 are easily damaged due to high temperatures. Moreover, to protect the image sensor 12 from damage due to high temperatures, the image sensor 12 is soldered to the flexible printed circuit board 13 using only a low-temperature soldering technique. As the soldering strength between the image sensor 12 and the flexible printed circuit board 13 is insufficient, the soldering area therebetween is small, and the flexible printed circuit board 13 is pulled and dragged by reciprocation of the base 11, the solder between the image sensor 12 and the flexible printed circuit board 13 often splits, thus adversely affecting operational quality of the image-sensing module 10.

Hence, there is a need for an image-sensing module that effectively enhances heat-dissipation effect, reduces probability for damage of components, increases overall structural strength, and promotes operational quality.

BRIEF SUMMARY OF THE INVENTION

A detailed description is given in the following embodiments with reference to the accompanying drawings.

An exemplary embodiment of the invention provides an image-sensing module comprising a base, an image sensor, a flexible printed circuit board, and a heat-dissipation board.

The base comprises a plurality of sidewalls and an accommodation hole encompassed by the sidewalls.

The image sensor comprises a CCD or a CMOS.

The flexible printed circuit board comprises a main portion, an installation portion, and a through hole. The installation portion bends and extends from the main portion. The through hole is formed on the installation portion.

The heat-dissipation board is fixed to a bottom surface of the installation portion of the flexible printed circuit board and is aligned with the through hole. The image sensor is fixed to a top surface of the installation portion of the flexible printed circuit board and is aligned with the through hole. The heat-dissipation board, flexible printed circuit board, and image sensor are accommodated in the accommodation hole of the base.

According to the aforementioned structure of the image-sensing module, heat from the image sensor and flexible printed circuit board can be rapidly conducted and dissipated to the exterior of the image-sensing module by the heat-dissipation board, thereby reducing the probability of damage, caused by a high temperature, for the image sensor 40 and flexible printed circuit board 50. Additionally, the heat-dissipation board can enhance the overall structural strength of the image-sensing module, promoting operational quality thereof.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. Specifically, directional terminology, such as "top," "bottom," "front," "back," etc., is used with reference to the orientation of the Figure(s) being described.

Figure 1:
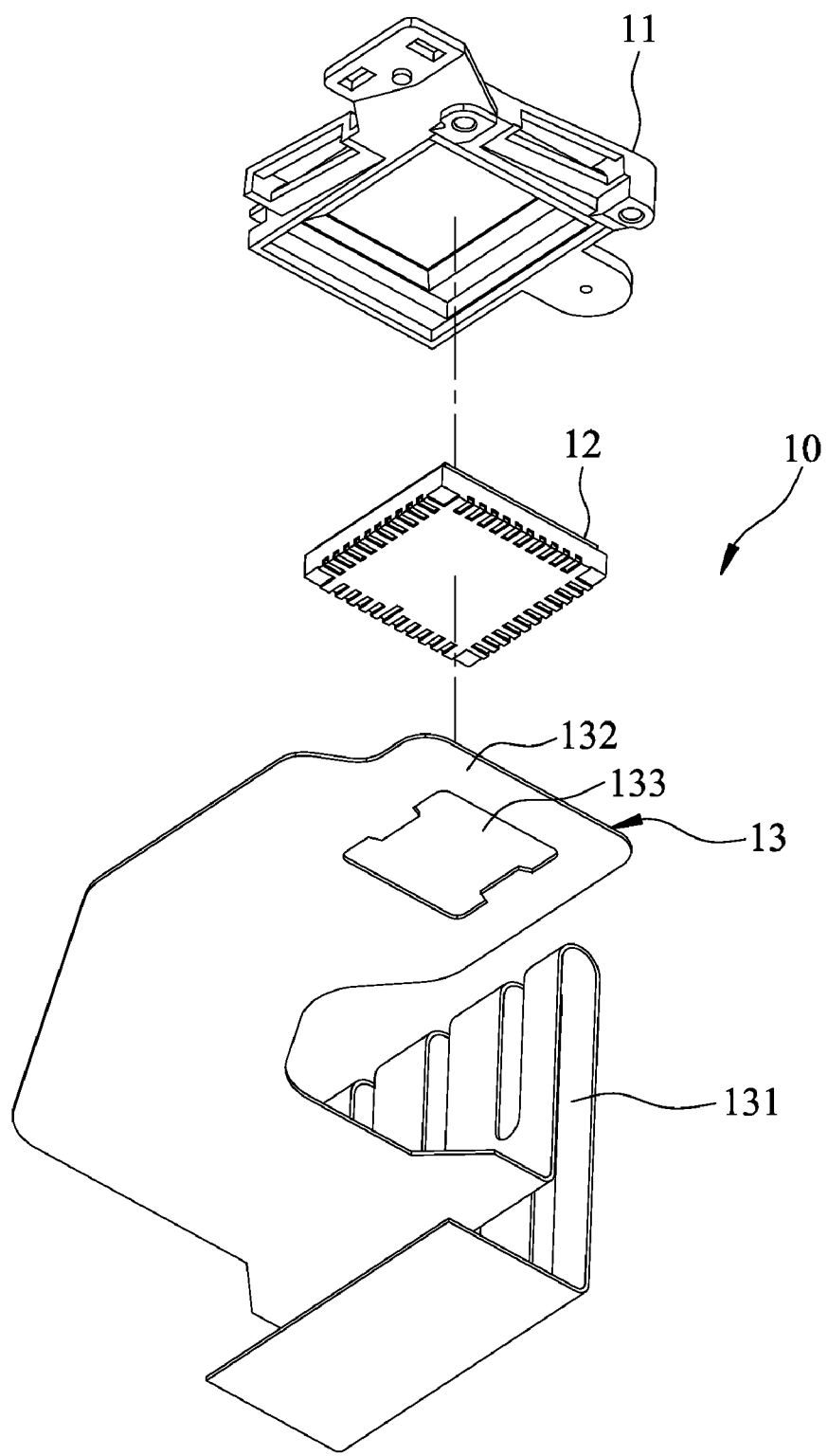
FIG. 1 is an exploded perspective view of a conventional image-sensing module.
Figure 2:
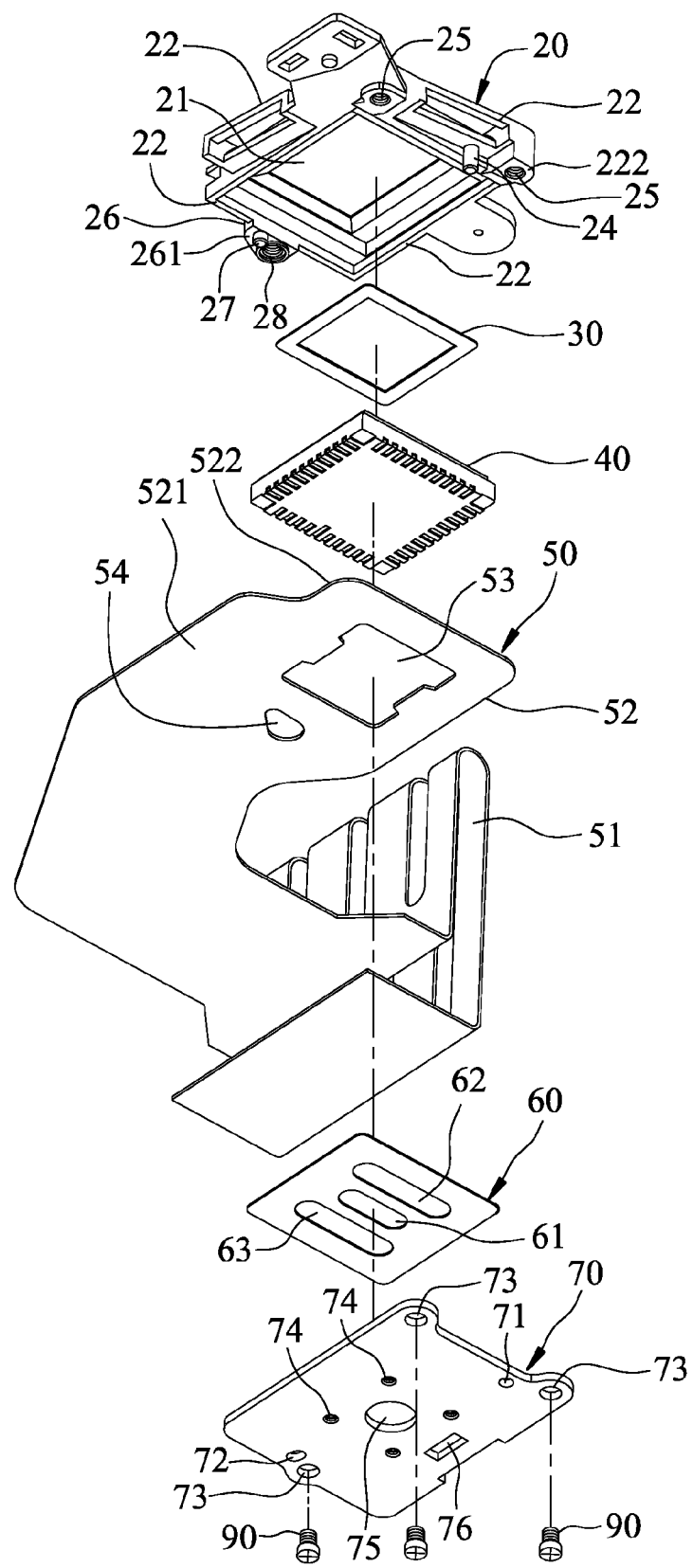
FIG. 2 is an exploded perspective view of an image-sensing module of a preferred embodiment of the invention.
Figure 3:
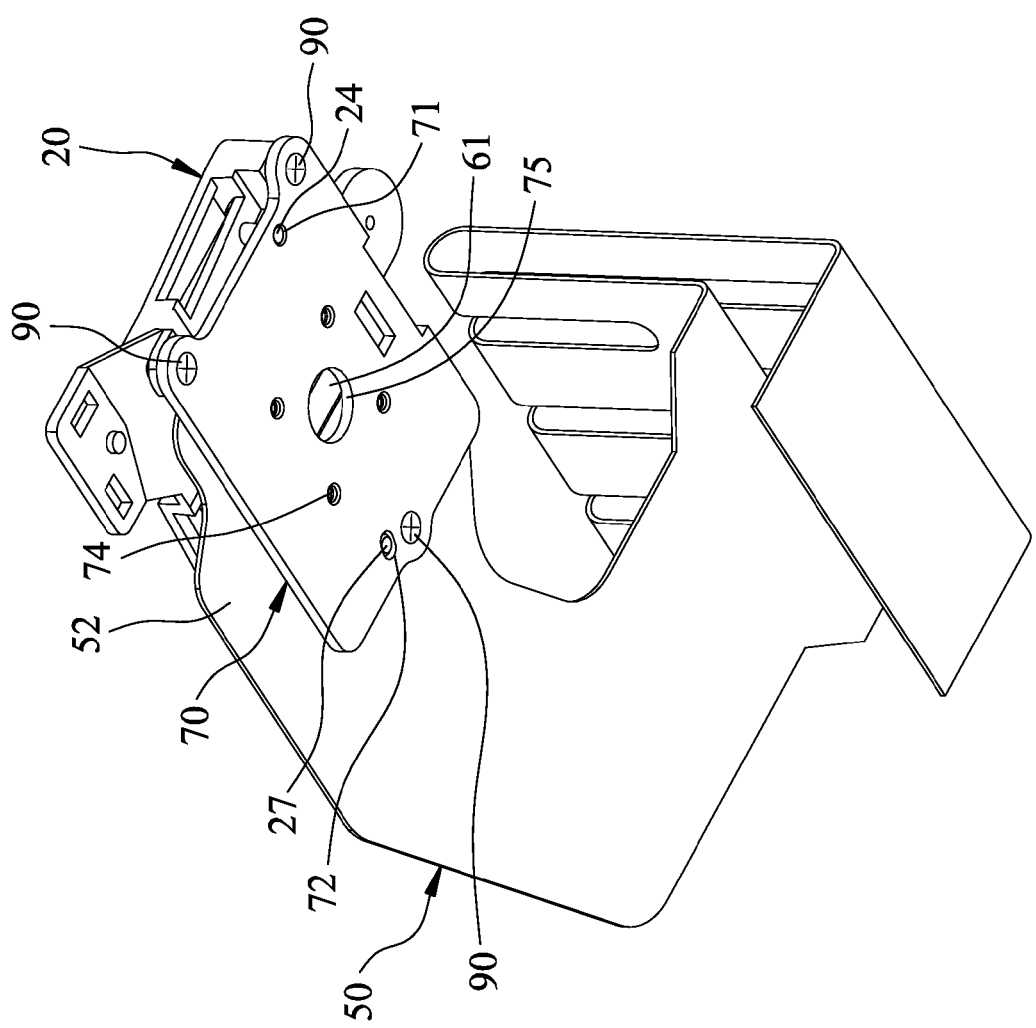
FIG. 3 is a perspective assembly view of the image-sensing module of the preferred embodiment of the invention.
Figure 4:
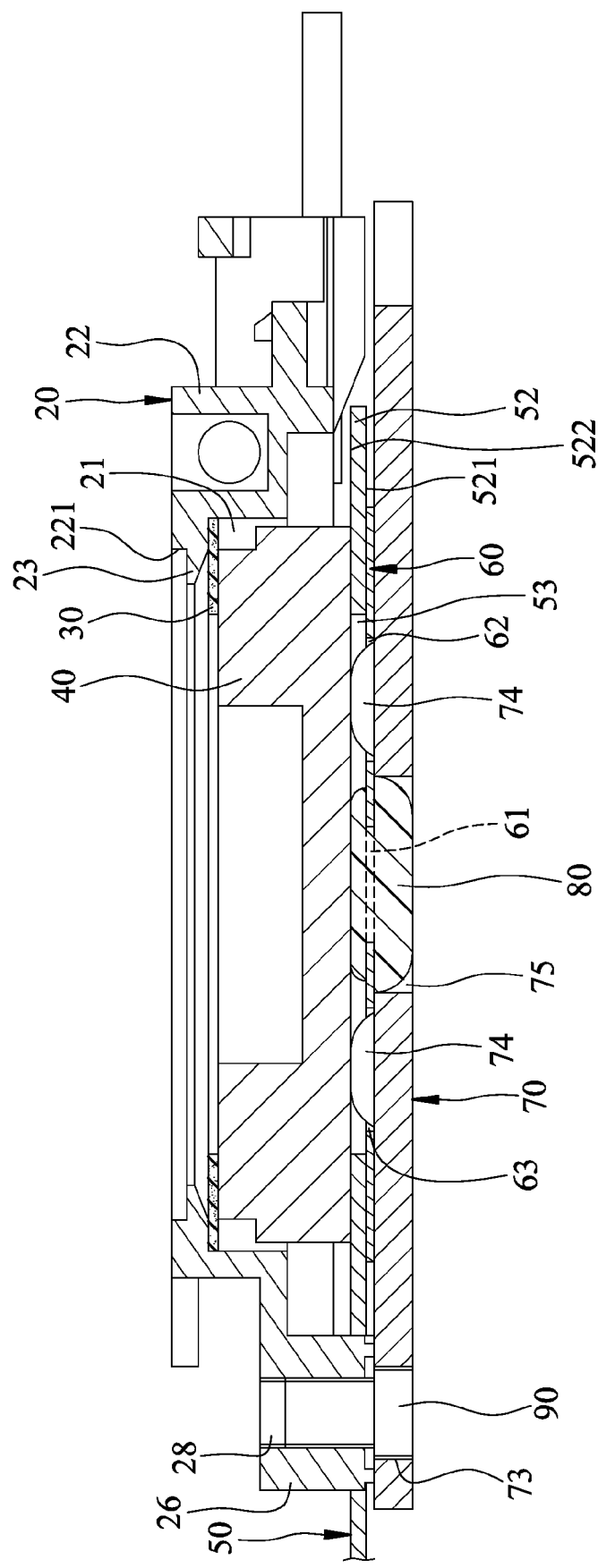
FIG. 4 is a schematic cross section of the image-sensing module of the preferred embodiment of the invention.

Referring to FIGS. 2, 3, and 4, an image-sensing module is disposed in an optical device and can move along a plane (not shown) perpendicular to an optical axis, performing anti-shake functions. In a preferred embodiment, the image-sensing module comprises a base 20, a washer 30, an image sensor 40, a flexible printed circuit board 50, a heat-dissipation board 60, and a reinforcement board 70.

The base 20 comprises four sidewalls 22, an accommodation hole 21, a retaining ring 23, a first positioning pillar 24, two fastening holes 25, a protruding portion 26, a second positioning pillar 27, and a fastening hole 28. The accommodation hole 21 is encompassed by the sidewalls 22. The retaining ring 23 is formed on an inner wall surface 221 of the sidewalls 22. The first positioning pillar 24 and fastening holes 25 are formed on a bottom surface 222 of one of the sidewalls 22. The protruding portion 26 is formed on another sidewall 22. The second positioning pillar 27 and fastening hole 28 are respectively formed on a bottom surface 261 of the protruding portion 26.

The washer 30 is disposed in the accommodation hole 21 of the base 20 and abuts the retaining ring 23.

The image sensor 40 may be a CCD (charge coupled device) or a CMOS (complementary metal-oxide semiconductor).

The flexible printed circuit board (FPC) 50 comprises a main portion 51, an installation portion 52, a through hole 53, and a fitting hole 54. The installation portion 52 bends and extends from the main portion 51. The through hole 53 is formed on the installation portion 52. The fitting hole 54 is aligned with the protruding portion 26.

The heat-dissipation board 60 is composed of metal and provides an area larger than the size of the through hole 53. Moreover, the heat-dissipation board 60 comprises a central through hole 61 and two outer through holes 62 and 63. The central through hole 61 is between the outer through holes 62 and 63.

The reinforcement board 70 is composed of metal and comprises a first fitting hole 71, a second fitting hole 72, three fastening holes 73, a plurality of protrusions 74, a first glue-applying hole 75, and a second glue-applying hole 76. The first fitting hole 71 and second fitting hole 72 are respectively aligned with the first positioning pillar 24 and second positioning pillar 27 of the base 20. The fastening holes 73 are respectively aligned with the fastening holes 25 and fastening hole 28 of the base 20. The protrusions 74 are respectively aligned with the outer through holes 62 and 63 of the heat-dissipation board 60 and are punched toward the top of the reinforcement board 70. The first glue-applying hole 75 is aligned with the central through hole 61 of the heat-dissipation board 60. The second glue-applying hole 76 is formed beside the first glue-applying hole 75.

When the image-sensing module is assembled, the heat-dissipation board 60 is attached to a bottom surface 521 of the installation portion 52 of the flexible printed circuit board 50 and is aligned with the through hole 53. The image sensor 40 is then soldered to a top surface 522 of the installation portion 52 of the flexible printed circuit board 50 using a low-temperature soldering technique and is aligned with the through hole 53. The washer 30 is disposed in the accommodation hole 21 of the base 20 and abuts the retaining ring 23. Then, the image sensor 40, flexible printed circuit board 50, and heat-dissipation board 60 are simultaneously assembled in the accommodation hole 21 of the base 20. At this point, the image sensor 40 abuts the washer 30. The reinforcement board 70 is assembled on a bottom side of the base 20. At this point, the first fitting hole 71 and second fitting hole 72 respectively fit on the first positioning pillar 24 and second positioning pillar 27, and the protrusions 74 pass through the outer through holes 62 and 63 of the heat-dissipation board 60 and the through hole 53 of the flexible printed circuit board 50 and abut the image sensor 40. Glue 80 is then filled in the central through hole 61 of the heat-dissipation board 60 and the through hole 53 of the flexible printed circuit board 50 via the first glue-applying hole 75 of the reinforcement board 70 and contacts the image sensor 40, such that the reinforcement board 70, heat-dissipation board 60, flexible printed circuit board 50, and image sensor 40 adhere to one another. Accordingly, the overall structural strength of the image-sensing module is enhanced. After multiple bolts 90 are respectively fastened into the fastening holes 73 of the reinforcement board 70 and the fastening holes 25 and fastening hole 28 of the base 20, assembly of the image-sensing module is complete.

Moreover, the glue may also be filled in the image-sensing module via the second glue-applying hole 76, further enhancing the overall structural strength of the image-sensing module and protecting the image-sensing module from damage by twisting.

Specifically, the present image-sensing module may omit the reinforcement board 70. The glue is directly filled between the image sensor 40 and the base 20, enabling adhesion therebetween.

In conclusion, the disclosed image-sensing module provides many advantages which are outlined as follows. Heat from the image sensor 40 and flexible printed circuit board 50 can be rapidly conducted and dissipated to the exterior of the image-sensing module by the heat-dissipation board 60, thereby reducing the probability of damage, caused by a high temperature, for the image sensor 40 and flexible printed circuit board 50. Additionally, the heat from the image sensor 40 can further be transmitted to the exterior of the image-sensing module via the protrusions 74 of the reinforcement board 70, enhancing heat dissipation thereof. Moreover, by arrangement of the heat-dissipation board 60 and reinforcement board 70 and adhesion among the reinforcement board 70, heat-dissipation board 60, flexible printed circuit board 50, and image sensor 40 using the glue 80, the overall structural strength of the image-sensing module can be enhanced. Even though the flexible printed circuit board 50 is frequently pulled or twisted, solder between the image sensor 40 and the flexible printed circuit board 50 does not split, thereby promoting operational quality of the image-sensing module. Furthermore, as the protrusions 74 of the reinforcement board 70 abut the image sensor 40, the disclosed image-sensing module can provide functions of calibration of inclination, thereby achieving an effect of imaging quality adjustment.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image-sensing module, comprising:
a base comprising a plurality of sidewalls and an accommodation hole encompassed by the sidewalls;
an image sensor;
a flexible printed circuit board comprising an installation portion and a through hole formed on the installation portion;
a heat-dissipation board fixed to a bottom surface of the installation portion of the flexible printed circuit board and aligned with the through hole, wherein the heat-dissipation board comprises a central through hole aligned with the through hole of the flexible printed circuit board and at least one outer through hole beside the central through hole, the image sensor is fixed to a top surface of the installation portion of the flexible printed circuit board and is aligned with the through hole, and the heat-dissipation board, flexible printed circuit board, and image sensor are accommodated in the accommodation hole of the base; and
a reinforcement board fixed to a bottom side of the base and comprising a first glue-applying hole aligned with the central through hole of the heat-dissipation board and at least one protrusion passing through the outer through hole of the heat-dissipation board to abut the image sensor, wherein glue is filled in the first glue-applying hole, combining the reinforcement board, heat-dissipation board, flexible printed circuit board, and image sensor.

2. The image-sensing module as claimed in claim 1, wherein the reinforcement board is composed of metal.

3. The image-sensing module as claimed in claim 1, wherein the reinforcement board further comprises a second glue-applying hole.

4. The image-sensing module as claimed in claim 1, wherein the base further comprises two positioning pillars formed on bottom surfaces of the sidewalls, and the reinforcement board further comprises two fitting holes receiving the positioning pillars.

5. The image-sensing module as claimed in claim 1, further comprising a plurality of bolts fastened between the reinforcement board and the base.

6. The image-sensing module as claimed in claim 1, further comprising a washer disposed in the accommodation hole of the base and abutted by the image sensor.

* * * * *